United States Patent [19]

Bhattacharyya et al.

[11] Patent Number: 5,369,545

[45] Date of Patent: Nov. 29, 1994

[54] DE-COUPLING CAPACITOR ON THE TOP OF THE SILICON DIE BY EUTECTIC FLIP BONDING

[75] Inventors: Bidyut K. Bhattacharyya; Debendra Mallik, both of Beaverton, Oreg.; You Y. Yu, Phoenix, Ariz.

[73] Assignee: Intel Corporation, Santa Clara, Calif.

[21] Appl. No.: 85,557

[22] Filed: Jun. 30, 1993

[51] Int. Cl.$^5$ .............................................. H01G 1/03
[52] U.S. Cl. .................. 361/306.2; 29/25.42; 257/724; 361/303; 361/306.3
[58] Field of Search ............... 29/25.42; 361/301.4, 361/303, 306.2, 306.3, 307, 313, 320, 321.2, 321.3, 321.4, 328, 329, 330, 734, 771, 774, 779, 808, 811; 257/723, 724, 777

[56] References Cited

U.S. PATENT DOCUMENTS

| | | | |
|---|---|---|---|
| 4,071,878 | 1/1978 | Stynes | 361/307 |
| 4,363,076 | 12/1982 | McIver | 361/771 |
| 4,628,404 | 12/1986 | Yokoe et al. | 361/321.4 |
| 4,654,694 | 3/1987 | Val | 361/321.2 |
| 4,661,192 | 4/1987 | McShane | 361/779 |
| 4,831,494 | 5/1989 | Arnold et al. | 361/306.3 |
| 4,852,227 | 8/1989 | Burks | 29/25.42 |
| 4,916,576 | 4/1990 | Herbert et al. | 361/734 |
| 5,095,402 | 3/1992 | Hernandez et al. | 361/306.2 |

Primary Examiner—Bruce A. Reynolds
Assistant Examiner—Gregory L. Mills
Attorney, Agent, or Firm—Blakely, Sokoloff Taylor & Zafman

[57] ABSTRACT

A high capacitance/low inductance capacitor module. The module comprises a plurality of conductive power planes that are separated from a plurality of conductive ground planes by layers of dielectric material. The power planes each have opposite extending tabs that are offset from similar tabs extending from the ground planes and which are coupled together by layers of conductive material. Likewise, the tabs of the ground planes are coupled together by additional layers of conductive material. The corresponding power and ground planes are also coupled together by vias located throughout the module. The conductive layers couple both sides of the corresponding conductive planes and provide contact pads for further assembly to a semiconductive die. The module is attached to the semiconductive die by a plurality of gold bumps which are formed on the top surface of the die.

4 Claims, 3 Drawing Sheets

DE-COUPLING CAPACITOR ON THE TOP OF THE SILICON DIE BY EUTECTIC FLIP BONDING

BACKGROUND OF THE INVENTION

1. Field of the Invention

The present invention relates to a high capacitance/low inductance capacitor module that can be coupled to a semiconductive die.

2. Description of Related Art

It is generally desirable to produce integrated circuits (ICs) which require less power and operate at higher speeds than existing devices. The operation of low power/high speed integrated circuits can be effected by the electrical noise generated by the continuous switching of the transistors located in the circuit. It is well known that the inductive noise of an IC can be reduced by connecting decoupling capacitors to the circuit.

U.S. application Ser. No. 07/837,285 filed by Mallick et al., and assigned to the same assignee as the present application, discloses an integrated circuit package which has a number of decoupling capacitors formed on a circuit board located within the package. The circuit board and capacitors are coupled to the semiconductive die by a plurality of parallel wires. The parallelism of the wires increases the inductance of the signals and reduces the effectiveness of the decoupling capacitors. It would therefore be desirable to directly mount the decoupling capacitors to the surface of the die to reduce the line length between the two devices.

To effectively decouple an integrated circuit such as a microprocessor, the capacitors must have a capacitance value between 10 and 200 nanoFaurads (nF) and an inductance of approximately 1 picoHenry (pH). A single conventional capacitor typically has an inductance value of approximately 50 pH. Therefore to create a decoupling capacitance circuit having a net inductance of 1 pH would require the assembly and wiring of 10 discrete capacitors. Assembling multiple discrete elements is time consuming and generally increases the overall cost of producing the IC package. It would therefore be desirable to provide a low inductance decoupling capacitor module which can be efficiently mass produced and easily assembled to the surface of a semiconductive device.

SUMMARY OF THE INVENTION

The present invention is a high capacitance/low inductance capacitor module. The module comprises a plurality of conductive power planes that are separated from a plurality of conductive ground planes by layers of dielectric material. The power planes each have opposite extending tabs that are offset from similar tabs extending from the ground planes. The power plane tabs are coupled together by layers of conductive material. Likewise, the tabs of the ground planes are also coupled together by separate layers of conductive material. The module also contains vias that extend through the layers of dielectric and to interconnect the corresponding power and ground planes.

The layers of conductive material couple both sides of the corresponding conductive planes and provide contact pads for further assembly to a semiconductive die. The module is attached to the semiconductive die by a plurality of gold bumps which are formed on the top surface of the die.

It is an object of the present invention to provide a capacitor module that has high capacitance and low inductance values.

It is also an object of the present invention to provide a high capacitance/low inductance capacitor module that can be readily assembled to a semiconductive die.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
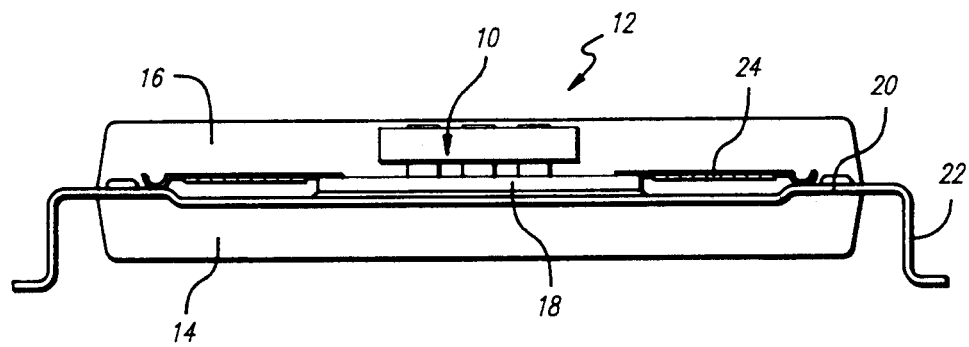
FIG. 1 is a cross-sectional side view of an electronic package that contains a capacitor module attached to a semiconductive die.

Referring to the drawings more particularly by reference numbers, FIG. 1 shows a capacitor module 10 integrated into an electronic package 12. The package 12 includes a base plate 14 and a cover plate 16 that house a semiconductive die 18. The die is typically an integrated circuit ("IC"). The IC is coupled to a lead frame 20 which has a plurality of leads 22 that extend from the package. The leads 22 are typically soldered to a printed circuit board (not shown) as is known in the art. The die 18 and lead frame 20 are coupled together by wires 24. The wires 24 are typically assembled by either wire bonding individual wires (wire bonding), or attaching a lead supporting tape (TAB bonding), to the die 18 and lead frame 20.

The capacitor module 10 is attached to a first surface 26 of the integrated circuit 18. The IC is preferably a microprocessor which has a large number of transistors (not shown). The continuous high speed switching of the transistors creates an inductive effect that can degrade the overall performance of the processor. The capacitor module 10 is connected to the die to filter out the inductance effects of the IC. The module 10 must therefore have relatively high capacitance and low inductance values. In the preferred embodiment, the capacitor module has a capacitance ranging between 10 to 200 nF and an inductance value of about 1 pH.

Figure 2:
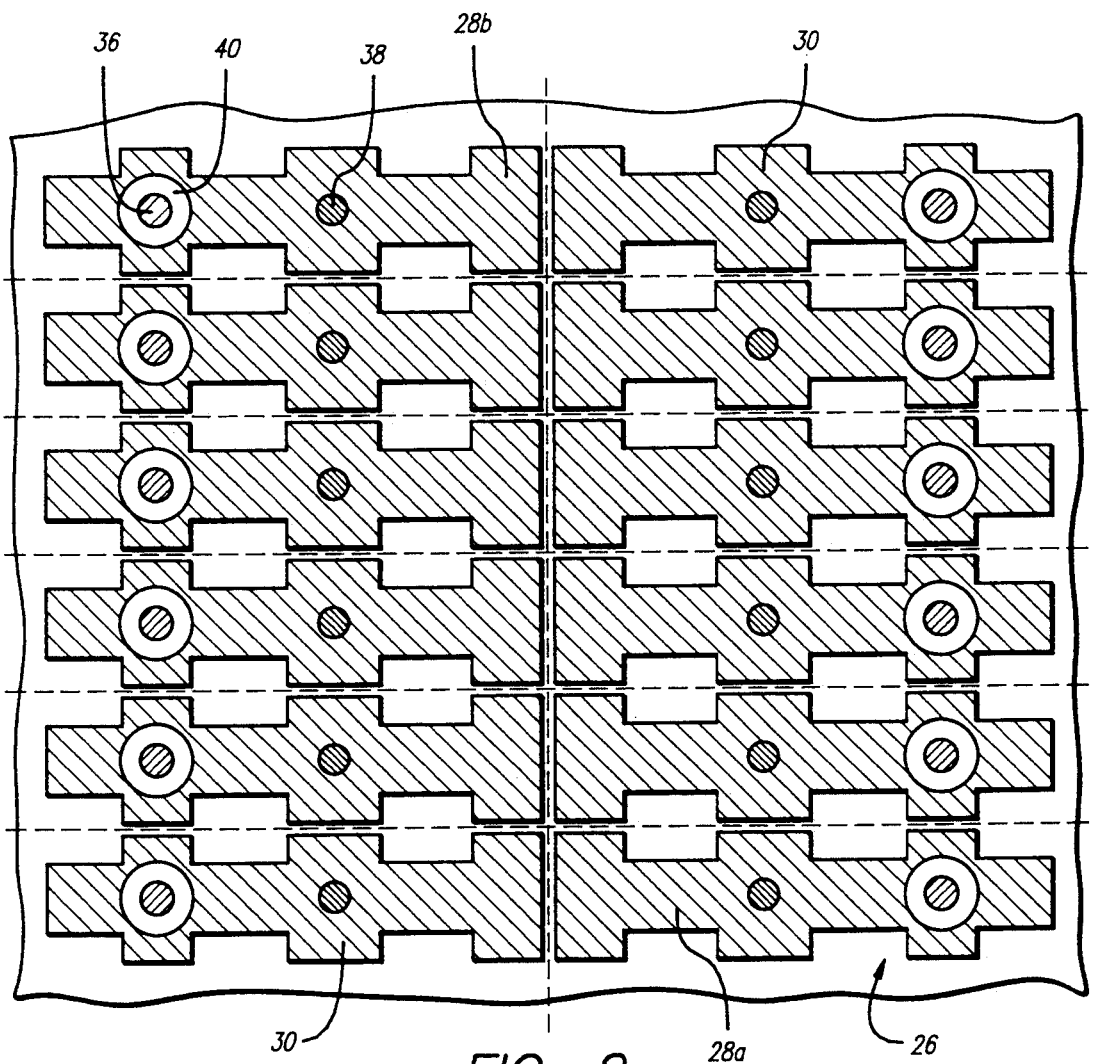
FIG. 2 is a top view of two sheets of dielectric tape that have patterns of metal applied thereto.
Figure 3:
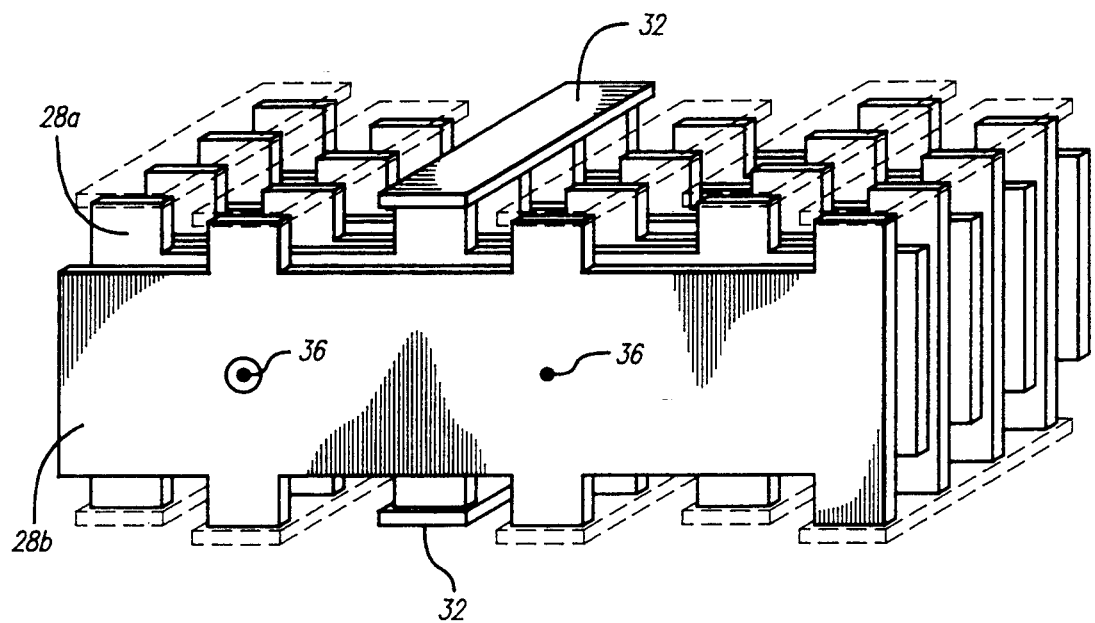
FIG. 3 is a perspective view of a plurality of laminated dielectric sheets each having a pattern of metal.
Figure 4:
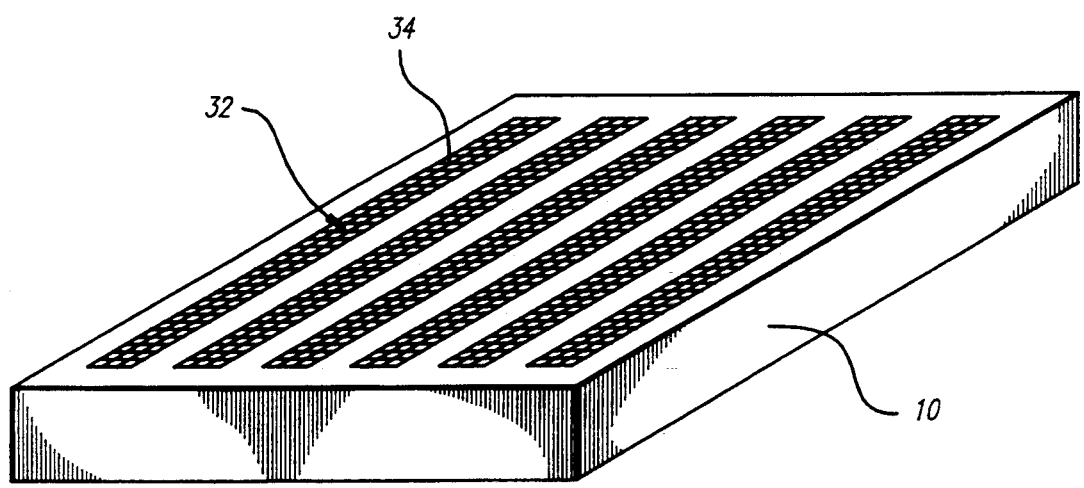
FIG. 4 is a perspective view showing layers of metallization along a surface of the capacitor module.

FIGS. 2-4 show a method for constructing the capacitor module 10. There is initially provided sheets of cofirable dielectric ceramic material 26 which is commonly referred to as green tape. In the preferred embodiment the green tape 26 has a thickness of approximately 0.001 inches and a dielectric constant between 9 and 100. A layer of metal 28 is then applied to the sheets 26 in the patterns shown in FIG. 2. In the preferred embodiment the metal is a paste which is applied through a template (not shown). The applied metal paste is typically 0.0005 inches thick. Representative examples of the tape and metal are aluminum oxide (tape) and tungsten (paste), and niobium lead and oxygen (tape) and silver palladium (paste).

The sheets are patterned into either a plurality of power planes 28a or a plurality of ground planes 28b. Each power and ground plane has a plurality of tabs 30 that extend in opposite directions. After the paste is applied to the dielectric material, the tape is cut along the dotted lines shown to create a plurality of individual power and ground planes. The cutting process creates a number of planes which each have the ends of the tabs 30 at the edges of the tape.

As shown in FIG. 3, the individual planes are stacked in an alternating fashion so that a power plane 28a is followed by a ground plane 28b and the ground plane 28b is adjacent to a power plane 28a and so forth and so on. The planes are laminated together and cofired to create a rigid structure. In the preferred embodiment, 100 layers of tape are laminated together and have a resulting dielectric constant ranging from 1000–2000. The outer layers of dielectric are preferably 0.006 thick to provide a thick wall around the module.

As shown in FIGS. 3 and 4, after the layers are laminated and fired, separate metallized areas 32 are formed adjacent to the tabs 30 of the planes. The metallized areas are formed on both sides of the modules. The tabs of the power and ground planes are staggered so that 6 of the metallized areas couple together the power planes and 6 of the metallized layers couple together the ground planes. In the preferred embodiment the areas of metal 32 are created by plating nickel and gold onto the module. As shown in FIG. 4, solder preforms 34 can be applied to the metal areas 32 on one side of the module. The preforms are preferably 65% gold and 35% tin by atomic weight.

To further reduce the electrical path and inductance of the module the corresponding power and ground planes can be coupled together with vias 36. As shown in FIG. 2 the vias 36 can be formed by applying an additional dot of metal paste 38 in the center of the tabs 30. A corresponding clearance hole 40 is punched in the tape so that the vias of the adjacent plane can extend therethrough. The vias of a power plane therefore extend through clearance holes of an adjacent ground plane and are attached to the power plane on the opposite side of the ground plane. Likewise, the vias of a ground plane extend through clearance holes in an adjacent power plane, to couple the ground plane to a correspond ground plane located on the opposite side of the power plane.

Figure 5:
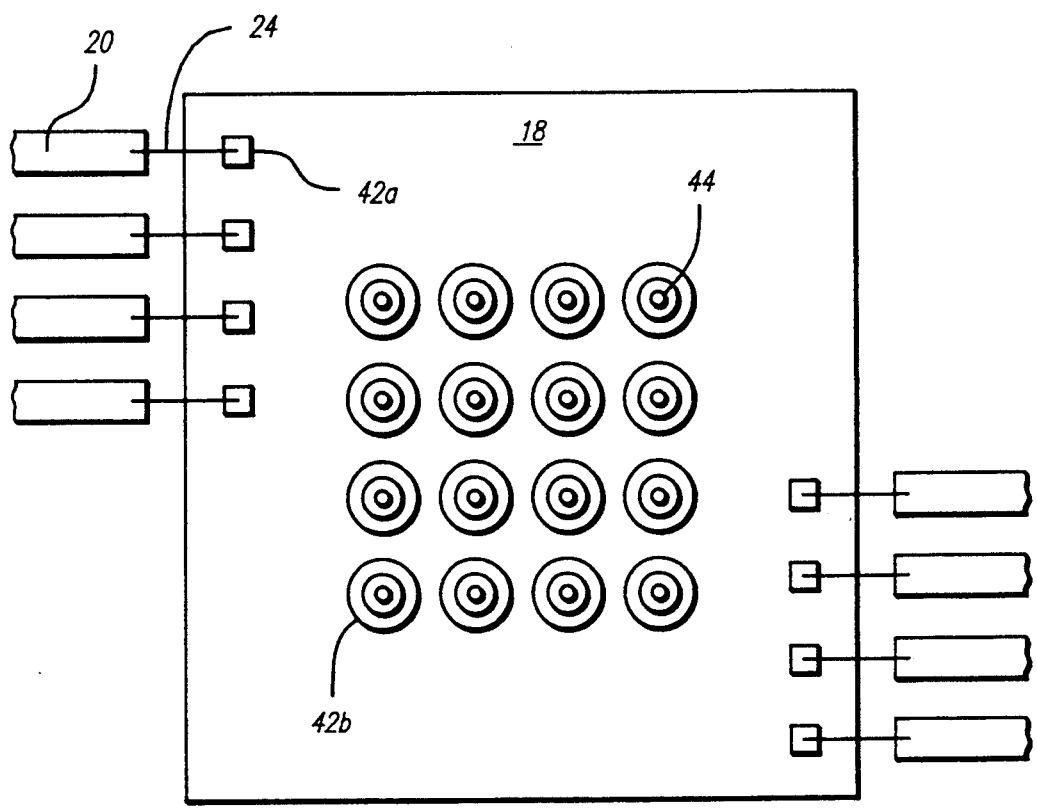
FIG. 5 is a top view showing a plurality of gold bumps applied to the top surface of the semiconductive device.
Figure 6:
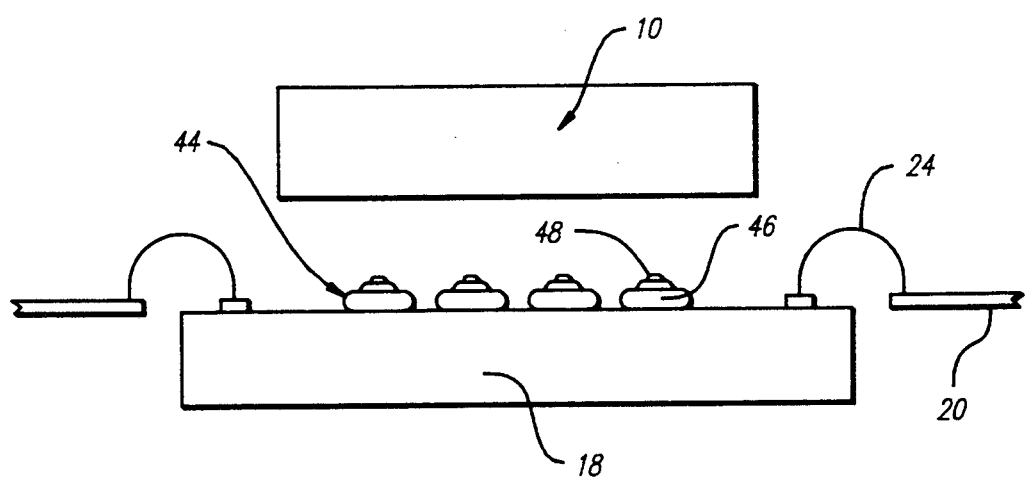
FIG. 6 is a side view of FIG. 5.

FIGS. 5 and 6 show a preferred method for coupling the capacitor module 10 to the die 18. The semiconductive die 18 will have a set of surface pads 42a along the edges of the die and another set located at an inner center portion of the die 42b. The outer pads 42a are coupled to the lead frame 20 with wires 24. A plurality of gold bumps 44 are applied to the center pads 42b.

In the preferred embodiment, the gold bumps 44 are formed by thermo/ultrasonically deforming the end of a gold wire until a gold ball 46 forms on the die. The wire is then cut to create the bump 46. The gold bumps 44 are preferable 0.004–0.008 inches high with a wire section 48 that is 0.001–0.002 inches above the ball section 46 of the bump. The wire section 48 provides a spring which will compensate for a lack of flatness of the module 10 and the die 18. The wire section 48 also provides an area for the solder preforms of the module to flow down onto the balls 46.

After the bold bumps 44 are formed, the module 10 is placed onto the die 18 and the two members are placed in an oven to reflow the bumps 44 and preforms 34 of the module 10. In the preferred embodiment, the oven set at approximately 310° C. To insure contact between the module and all of the gold bumps 44, a weight can be placed onto the module 10 before being placed into the oven. What is thus provided is a high capacitance/low inductance capacitor module 10 that is coupled directly to a semiconductive die 18. The attachment of the module 10 to the inner area of the die reduces the number of outer pads 42a required to couple the IC to the lead frame of the package. Reducing the number of pads, allows the pads to be spaced farther apart, thereby reducing the cost of producing the IC.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:
  a semiconductive die that has a plurality of first gold bumps located along a first edge of said die and a plurality of second gold bumps located on an inner area of said die; and,
  a capacitor module attached to said second gold bumps, wherein said capacitor module includes a plurality of conductive power planes separated from a plurality of conductive ground planes by layers of dielectric material constructed from dielectric tape, said conductive power planes having tabs that extend in a first direction and an opposite second direction, said powers tabs extending in said first direction being coupled by first conductive power areas and said power tabs extending in said second direction being coupled by second conductive power areas, said conductive ground planes also having tabs that extend in a first direction and an opposite second direction, said ground tabs extending in said first direction being coupled by first conductive ground areas and said around tabs extending in said second direction being coupled by second conductive around areas, said conductive power planes being further coupled together by a plurality of power vias, and said conductive ground planes being further coupled together by a plurality of around vias.

2. The capacitor module as recited in claim 1, wherein said conductive planes are constructed from a metal paste.

3. A method for coupling a capacitor module to a semiconductive device, comprising the steps of:
  a) providing a first layer of dielectric tape which has a first layer of patterned metal, said first layer of patterned metal including a plurality of tabs extending in a first direction and a plurality of tabs extending in a second direction;
  b) placing a plurality of first conductive dots on said first layer of patterned metal;
  c) attaching a second layer of dielectric to said first layer of patterned metal, said second layer of dielectric tape having a second layer of patterned metal separated from said first layer of patterned metal by said second layer of dielectric tape, said second layer of patterned metal including a plurality of tabs extending in a first direction and a plurality of tabs extending in a second direction, said tabs of said second layer of patterned metal being offset from said tabs of said first layer of patterned metal, said second layer of dielectric tape having a plurality of first through holes that are aligned with said first conductive dots;

d) placing a plurality of second conductive dots on said second layer of patterned metal;

e) attaching a third layer of dielectric tape to said second layer of patterned metal, said third layer of dielectric tape having a third layer of patterned metal separated from said second layer of patterned metal by said third layer of dielectric material, said third layer of patterned metal including a plurality of tabs extending in a first direction and a plurality of tabs extending in a second direction, said tabs of said third layer of patterned metal being offset from said tabs of said second layer of patterned metal and essentially aligned with said tabs of said first layer of patterned metal, said third layer of dielectric tape having a plurality of second through holes that are aligned with said second conductive dots;

f) repeating steps (b) and (c) a predetermined number of times;

g) applying outer layers of metal to said tabs to interconnect said tabs;

h) curing said dielectric layers to harden said dielectric layers;

i) placing a plurality of gold bumps on a first surface of a semiconductive die; and, j) attaching said outer layers of metal to said gold bumps and said semiconductive die.

4. The method as recited in claim 3, further comprising the step of plating said outer layers of metal with gold.

* * * * *

UNITED STATES PATENT AND TRADEMARK OFFICE
CERTIFICATE OF CORRECTION

PATENT NO. : 5,369,545
DATED : November 29, 1994
INVENTOR(S) : Bhattacharyya et al.

It is certified that error appears in the above-identified patent and that said Letters Patent is hereby corrected as shown below:

In column 4 at line 42 delete "around" and insert --ground--

In column 4 at line 44 delete "around" and insert --ground--

In column 4 at line 48 delete "around" and insert --ground--

In column 6 at line 8 delete "lavers" and insert --layers--

Signed and Sealed this

Seventeenth Day of December, 1996

Attest:

BRUCE LEHMAN

Attesting Officer  Commissioner of Patents and Trademarks